US010818762B2

(12) United States Patent
Schultz

(10) Patent No.: US 10,818,762 B2
(45) Date of Patent: Oct. 27, 2020

(54) GATE CONTACT OVER ACTIVE REGION IN CELL

(71) Applicant: Advanced Micro Devices, Inc., Santa Clara, CA (US)

(72) Inventor: Richard T. Schultz, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/989,604

(22) Filed: May 25, 2018

(65) Prior Publication Data

US 2019/0363167 A1   Nov. 28, 2019

(51) Int. Cl.
*H01L 21/00*   (2006.01)
*H01L 29/423*   (2006.01)
(Continued)

(52) U.S. Cl.
CPC .... *H01L 29/4238* (2013.01); *H01L 21/76895* (2013.01); *H01L 23/535* (2013.01); *H01L 27/0207* (2013.01); *H01L 29/42392* (2013.01); *H01L 29/6656* (2013.01); *H01L 29/66666* (2013.01); *H01L 29/78642* (2013.01); *H01L 29/78696* (2013.01)

(58) Field of Classification Search
None
See application file for complete search history.

(56) References Cited

U.S. PATENT DOCUMENTS 5,889,329 A    3/1999  Rostoker et al.
9,837,398 B1   12/2017 Rowhani et al.
(Continued)

FOREIGN PATENT DOCUMENTS

EP       3174105 A1     5/2017
WO    2007073599 A1     7/2007

OTHER PUBLICATIONS

International Search Report and Written Opinion in International Application No. PCT/US2017/052775, dated Mar. 26, 2018, 17 pages.

(Continued)

*Primary Examiner* — Reema Patel
(74) *Attorney, Agent, or Firm* — Kowert Hood Munyon Rankin and Goetzel PC; Rory D. Rankin

(57) ABSTRACT

A system and method for laying out power grid connections for standard cells are described. In various implementations, gate metal is placed over non-planar vertical conducting structures, which are used to form non-planar devices (transistors). Gate contacts connect gate metal to gate extension metal (GEM) above the gate metal. GEM is placed above the gate metal and makes a connection with gate metal through the one or more gate contacts. Gate extension contacts are formed on the GEM above the active regions. Similar to gate contacts, gate extension contacts are formed with a less complex fabrication process than using a self-aligned contacts process. Gate extension contacts connect GEM to an interconnect layer such as a metal zero layer. Gate extension contacts are aligned vertically with one of the non-planar vertical conducting structures. Therefore, in an implementation, one or more gate extension contacts are located above the active region.

20 Claims, 7 Drawing Sheets

(51) Int. Cl.
*H01L 21/768* (2006.01)
*H01L 23/535* (2006.01)
*H01L 27/02* (2006.01)
*H01L 29/66* (2006.01)
*H01L 29/786* (2006.01)

(56) References Cited

U.S. PATENT DOCUMENTS

| | | |
|---|---|---|
| 2005/0212562 A1 | 9/2005 | Gliese et al. |
| 2007/0157144 A1 | 7/2007 | Mai et al. |
| 2007/0278528 A1 | 12/2007 | Ato et al. |
| 2009/0187871 A1 | 7/2009 | Cork |
| 2010/0148219 A1 | 6/2010 | Shimizu |
| 2013/0087834 A1 | 4/2013 | Park et al. |
| 2013/0155753 A1 | 6/2013 | Moon et al. |
| 2014/0077305 A1* | 3/2014 | Pethe ............ H01L 23/53257 257/368 |
| 2014/0145342 A1 | 5/2014 | Schultz et al. |
| 2014/0231921 A1* | 8/2014 | Liaw ............ G11C 5/06 257/368 |
| 2014/0264742 A1 | 9/2014 | Yen et al. |
| 2016/0276287 A1 | 9/2016 | Iwabuchi |
| 2017/0011999 A1 | 1/2017 | Heo |
| 2017/0154848 A1 | 6/2017 | Fan et al. |
| 2017/0207166 A1 | 7/2017 | Lai et al. |
| 2018/0090440 A1 | 3/2018 | Schultz et al. |
| 2018/0183414 A1 | 6/2018 | Guo et al. |
| 2019/0065650 A1 | 2/2019 | Pelloie |
| 2019/0155979 A1 | 5/2019 | Schultz |

OTHER PUBLICATIONS

International Search Report and Written Opinion in International Application No. PCT/US2018/052369, dated Jan. 7, 2019, 16 pages.
Non-Final Office Action in U.S. Appl. No. 15/275,028, dated Sep. 28, 2018, 10 pages.
Non-Final Office Action in U.S. Appl. No. 15/819,879, dated Mar. 18, 2019, 10 pages.
Final Office Action in U.S. Appl. No. 15/275,028, dated May 16, 2019, 12 pages.
Schultz, Richard T., U.S. Appl. No. 15/965,311, entitled "Metal Zero Contact Via Redundancy On Output Nodes and Inset Power Rail Architecture", filed Apr. 27, 2018, 36 pages.
International Search Report and Written Opinion in International Application No. PCT/US2019/024364, dated Jul. 15, 2019, 13 pages.

* cited by examiner

GATE CONTACT OVER ACTIVE REGION IN CELL

BACKGROUND

Description of the Relevant Art

As both semiconductor manufacturing processes advance and on-die geometric dimensions reduce, semiconductor chips provide more functionality and performance while consuming less space. While many advances have been made, design issues still arise with modern techniques in processing and integrated circuit design that limit potential benefits. For example, capacitive coupling, electro migration, leakage currents and processing yield are some issues which affect the placement of devices and the routing of signals across an entire die of a semiconductor chip. Additionally, as the transistor dimensions decrease, the short channel effects increase. Other examples of short channel effects other than leakage current are latch-up effects, drain-induced barrier lowering (DIBL), punch-through, performance dependency on temperature, impact ionization, and parasitic capacitance to the silicon substrate and to the wells used for the source and drain regions. Thus, these issues have the potential to delay completion of the design and affect the time to market.

Non-planar transistors are a recent development in semiconductor processing for reducing short channel effects. Tri-gate transistors, Fin field effect transistors (FETs) and gate all around (GAA) transistors are examples of non-planar transistors. The processing steps for non-planar devices (transistors) are more complex than the processing steps for planar devices (transistors). In order to improve each of scaling and metal routing for standard cell layouts with non-planar devices, changes to the processing steps are made when these changes provide sufficient yield and do not increase the manufacturing costs above a limit. When these changes are made in the layout, the place-and-route (PNR) layout tools and rules setup for non-planar devices also change.

When the placement of contacts is flexible within a standard cell layout, each of the scaling and metal routing improves for the entire standard cell library. However, the flexibility reduces when short circuits occur, which reduce yield, and the processing steps become appreciably complex. When the flexibility of the contact placement reduces, the standard cells increase in size and the amount of available metal tracks for routing decreases.

In view of the above, efficient methods and systems for creating layout for non-planar cells are desired.

BRIEF DESCRIPTION OF THE DRAWINGS

The advantages of the methods and mechanisms described herein may be better understood by referring to the following description in conjunction with the accompanying drawings, in which.

Figure 1:
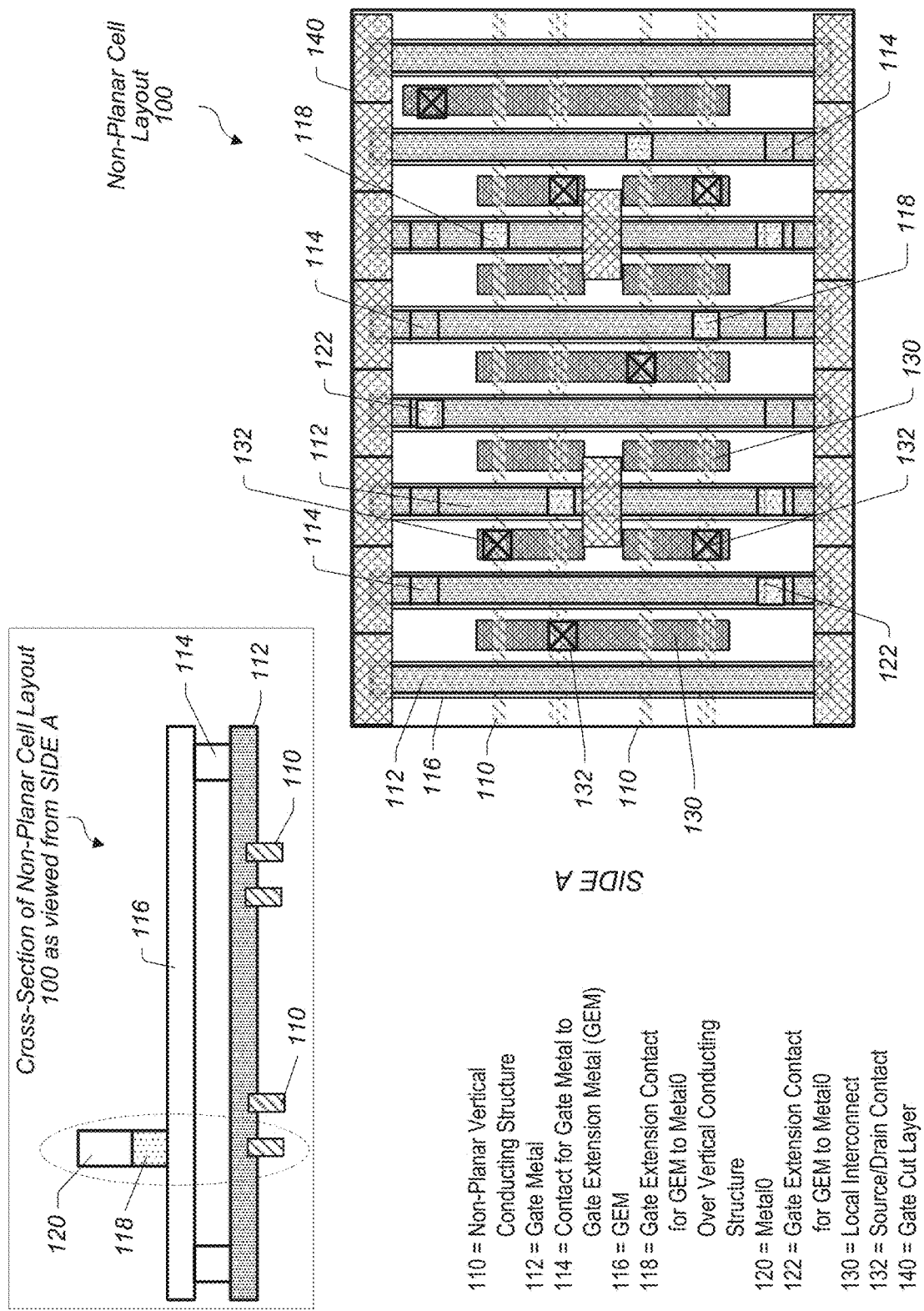
FIG. 1 is a generalized diagram of top and cross-sectional views of a cell layout with non-planar devices.

While the invention is susceptible to various modifications and alternative forms, specific implementations are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the methods and mechanisms presented herein. However, one having ordinary skill in the art should recognize that the various implementations may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Systems and methods for creating layout for non-planar cells are contemplated. In some implementations, the cell layout is a standard cell in a cell layout library. In other implementations, the cell layout is a custom designed cell, which is separate from the standard cell layout library. In various implementations, gate metal is placed over non-planar vertical conducting structures. The non-planar vertical conducting structures are used to form non-planar devices (transistors). Examples of non-planar devices are tri-gate transistors, fin field effect transistors (FETs) and gate all around (GAA) transistors. In some implementations, gate contacts connect gate metal to gate extension metal (GEM) above the gate metal. In an implementation, GEM is only used above the gate metal.

In an implementation, a single gate contact per column of gate metal is included in cell layout to connect gate metal to GEM. In other implementations, two or more gate contacts are used to connect gate metal to GEM, which increases yield. In some implementations, the separate two or more gate contacts are placed at the top and bottom of cell layout for several columns.

Typically, a gate contact or gate via is not located directly over the active region such as over one of the non-planar vertical conducting structures. To do so typically includes a complex semiconductor fabrication process, which includes using a self-aligned contacts process for the diffusion contact and gate contact. By placing gate contacts outside the active regions, and thus, placed separate from the non-planar vertical conducting structures, a complex semiconductor fabrication process, which includes using a self-aligned contacts process for gate contacts, is not used. Rather, a less complex fabrication process is used instead to place gate contacts. Following, GEM is placed above the gate metal and makes a connection with gate metal through the one or more gate contacts.

In various implementations, gate extension contacts are formed above the active regions on the GEM. Similar to gate contacts between the gate metal and the GEM, in various implementations, gate extension contacts are formed with a less complex fabrication process than using a self-aligned contacts process. Gate extension contacts connect GEM to an interconnect layer such as a metal zero layer. Gate extension contacts do not connect to the gate contacts or the gate metal. In some implementations, gate extension contacts are aligned vertically with one of the non-planar vertical conducting structures. Therefore, in an implementation, one or more gate extension contacts are located above the active region. Accordingly, in an implementation, the height of cell layout is reduced, which improves scalability and metal track routing.

Referring to FIG. 1, a generalized block diagram of non-planar cell layout 100, which is a top view of cell layout, is shown. Additionally, a generalized block diagram of a cross-section view of the same cell layout from Side A, is shown. As shown, Side A is to the left of non-planar cell layout 100. In the illustrated implementation, the p-type metal oxide semiconductor (pmos) field effect transistors (fets) are at the top of cell layout 100. The n-type metal oxide semiconductor (nmos) field effect transistors (fets) are at the bottom of cell layout 100. Here, the active regions are not shown in the cell layout 100 for ease of illustration. In some implementations, cell layout 100 is part of a standard cell layout library. In other implementations, cell layout 100 is custom layout cells for particular areas of a chip design.

In various implementations, the layout techniques shown in FIGS. 1-2 and 5-7 are used for a variety of other standard cells and custom cells used for a variety of complex gates and functional units. In various implementations, the devices (transistors) in the cell layout 100 are non-planar devices (transistors). Non-planar devices are a recent development in semiconductor processing for reducing short channel effects. Tri-gate transistors, Fin field effect transistors (FETs) and gate all around (GAA) transistors are examples of non-planar devices.

The non-planar vertical conducting structures 110 come up out of the page in a three-dimensional manner. As used herein, the non-planar vertical conducting structures 110 are also referred to as "vertical structures 110." It is noted that the vertical structures 110 are considered vertical due to coming out of the page in a three-dimensional manner although the vertical structures 110 are routed in a horizontal direction. In various implementations, the vertical structures 110 are included in one of the above types of non-planar devices such as tri-gate transistors, fin field effect transistors (FETs) and gate all around (GAA) transistors.

In some implementations, the non-planar devices in cell layout 100 are fabricated by one of the immersion lithography techniques, the double patterning technique, the extreme ultraviolet lithography (EUV) technique, and the directed self-assembly (DSA) lithography technique. In some implementations, the EUV technique provides more flexibility relative to via and contact modules relative to other techniques. As shown, cell layout 100 uses gate metal 112 in a vertical direction. In some implementations, titanium nitride (TiN) is used for the gate metal 112. The boundaries of the active regions are not shown for ease of illustration, but the rectangular boundaries of active regions are within a relatively close proximity of the vertical structures 110 and gate metal 112. The layer 140 is used to cut the gate layer and shows where the gate metal 112 start and stop. As shown, each of the third and sixth columns have separate gates for the top and bottom of the columns due to layer 140 placed in the middle of cell layout 100.

The local interconnect 130 is routed in a vertical direction similar to the gate metal 112. In some implementations, local interconnect 130 is copper, tungsten or cobalt and the material used is based on the design tradeoff between resistance and process dependability. In an implementation, copper, tungsten or cobalt contacts 132 are used for the source and drain regions. Metal 0 (M0 or Metal0) 120 is used for local interconnections in the horizontal direction. For ease of illustration, Metal0 120 is not shown in cell layout 100, but rather only in the cross-section view.

The gate contact 114 connects gate metal 112 to gate extension metal (GEM) 116. In the illustrated implementation, GEM 116 is only used above the gate metal 112. The separate gate contacts 114 are seen at the top of cell layout 100 and the bottom of cell layout 100 for several columns. In some implementations, a single gate contact 114 per column is included in cell layout 100 to connect gate metal 112 to GEM 116. In other implementations, two or more gate contacts 114 are used to connect gate metal 112 to GEM 116, which increases yield.

Typically, a gate contact or gate via is not located directly over the active region such as over one of the vertical structures 110. To do so typically includes a complex semiconductor fabrication process, which includes using a self-aligned contacts process for the diffusion contact and gate contact. Here, as shown in each of cell layout 100 and the cross-section view, gate contacts 114 are placed outside the active regions, and thus, placed separate from the vertical structures 110. Therefore, a complex semiconductor fabrication process, which includes using a self-aligned contacts process for gate contacts 114, is not used. Rather, a less complex fabrication process is used instead to place gate contacts 114 outside the active regions. Following, GEM 116 is placed above the gate metal 112 and makes a connection with gate metal 112 through the gate contacts 114. Now, in various implementations, gate contacts 118 are formed above the active regions. Similar to gate contacts 114, in various implementations, gate extension contacts 118 are formed with a less complex fabrication process than using a self-aligned contacts process.

Gate extension contacts 118 connect GEM 116 to the horizontal Metal0 120. Gate extension contacts 118 do not connect to the gate contacts 114 or the gate metal 112. It is noted that one or more of the gate extension contacts 118 are aligned vertically with one of the vertical structures 110. Therefore, in an implementation, one or more gate extension contacts 118 are located above the active region. Accordingly, in an implementation, the height of cell layout 100 is reduced, which improves scalability and metal track routing.

Figure 2:
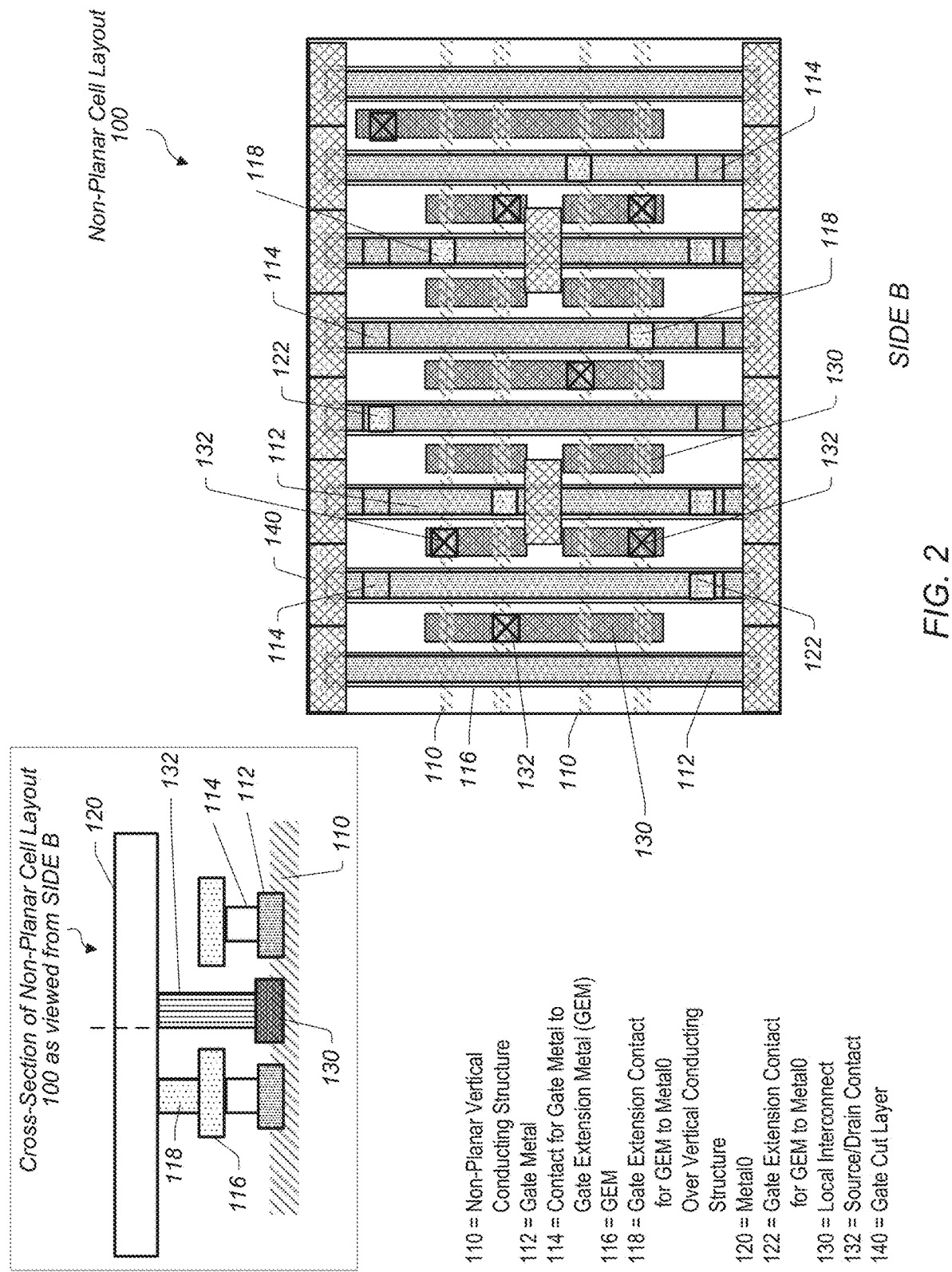
FIG. 2 is a generalized diagram of top and cross-sectional views of a cell layout.

Turning now to FIG. 2, a generalized block diagram of non-planar cell layout 100, which is a top view of cell layout, is shown. Additionally, a generalized block diagram of a cross-section view of the same cell layout from Side B, is shown. As shown, Side B is at the bottom of non-planar cell layout 100. Layout elements described earlier are numbered identically. Although each of cell layout 100 is shown as a two-dimensional diagram, there are three-dimensional elements depicted in the diagrams. As described earlier, each of the vertical structures 110 is considered vertical due to coming out of the page in a three-dimensional manner although the vertical structures 110 are routed in a horizontal direction.

In an implementation, in the cross-section view, source/drain contact 132 is further out of the page in a three-dimensional manner than gate extension contact 118. Next, gate extension contact 118 is further out of the page than each of gate contacts 114. Metal0 120 making contact with source/drain contact 132 is further out of the page than metal0 120 making contact with gate extension contact 118. Therefore, a dashed line in the cross-section view is used to separate the two separate horizontal routes of metal0 120. The metal0 120 on the right of the dashed line is further out of the page than the metal0 120 on the left of the dashed line. In an implementation, in the cross-section view, each of gate extension contact 118 and vertical structure 110 is no further out of the page than the other. Accordingly, gate extension contact 118 is aligned vertically with vertical structures 110 in the cross-section view, and gate extension contact 118 is located above the active region.

Figure 3:
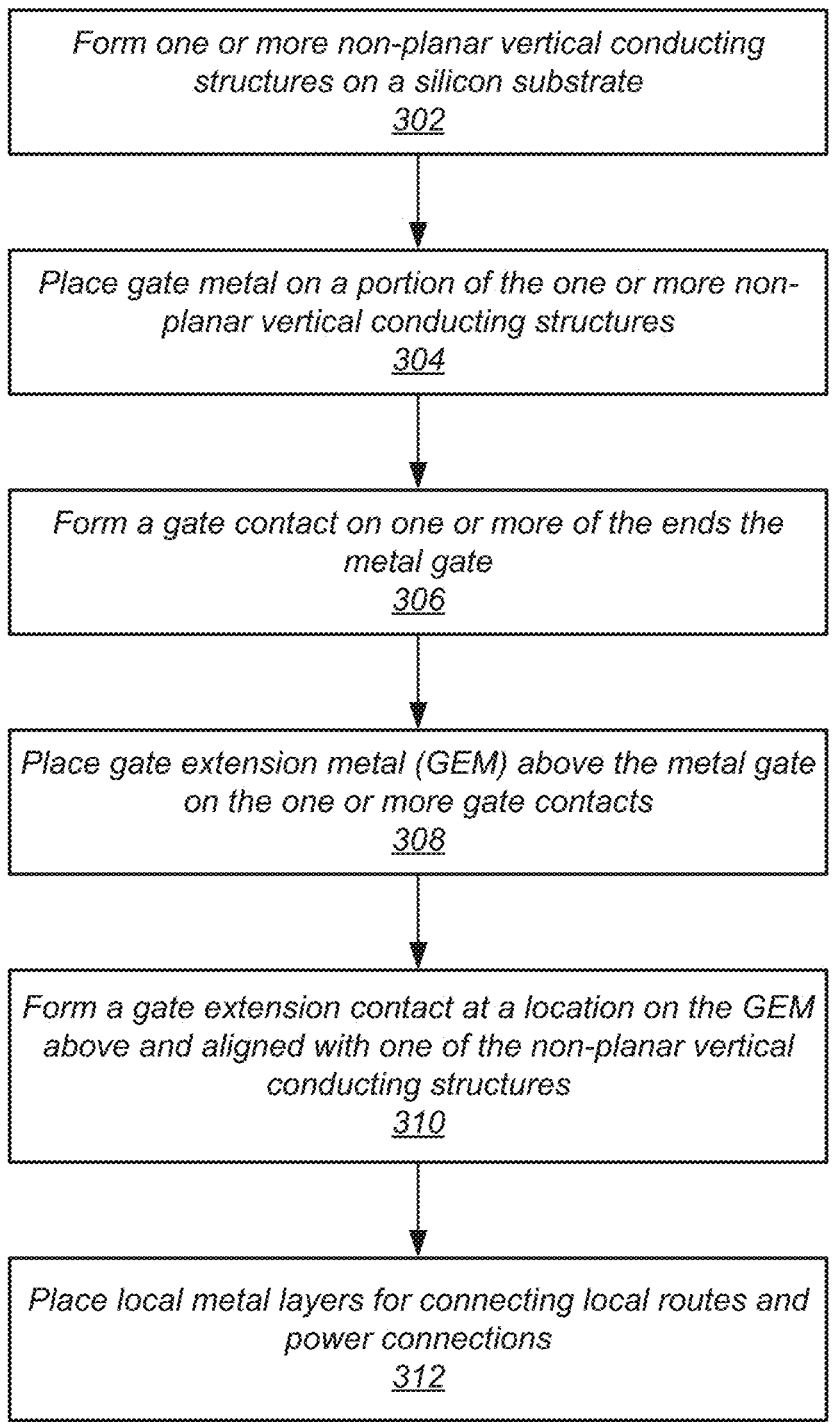
FIG. 3 is a generalized diagram of a method for creating cell layout with contacts over gates in an active region of a non-planar device.

Referring now to FIG. 3, a generalized block diagram of a method 300 for creating cell layout with contacts over gates in an active region of a non-planar device is shown. For purposes of discussion, the steps in this implementation (as well as in FIGS. 4 and 8) are shown in sequential order. However, in other implementations some steps occur in a different order than shown, some steps are performed concurrently, some steps are combined with other steps, and some steps are absent.

One or more non-planar vertical conducting structures are formed on a silicon substrate (block 302). In various implementations, the non-planar vertical conducting structures are used to fabricate one of a variety of non-planar devices such as tri-gate transistors, fin field effect transistors (FETs) and gate all around (GAA) transistors. Gate metal is placed on a portion of the one or more non-planar vertical conducting structures (block 304). A gate contact is formed on one or more of the ends the metal gate (block 306). In various implementations, the gate contacts are not formed over one of the non-planar vertical conducting structures.

Gate extension metal (GEM) is placed above the metal gate on the one or more gate contacts (block 308). In an implementation, the length of the GEM is the same or greater than the length of the gate metal. In another implementation, the length of the GEM is less than the length of the gate metal. A gate extension contact is formed at a location on the GEM both above and aligned with one of the non-planar vertical conducting structures (block 310). Therefore, in various implementations, the gate extension contact is formed above the active region. Local metal layers are placed for connecting local routes and power connections (block 312). For example, a metal zero layer is placed to make contact with the gate extension contact and route a signal to other vias. In some implementations, the cell layout is a standard cell in a cell layout library. In other implementations, the cell layout is a custom designed cell, which is separate from the standard cell layout library.

Figure 4:
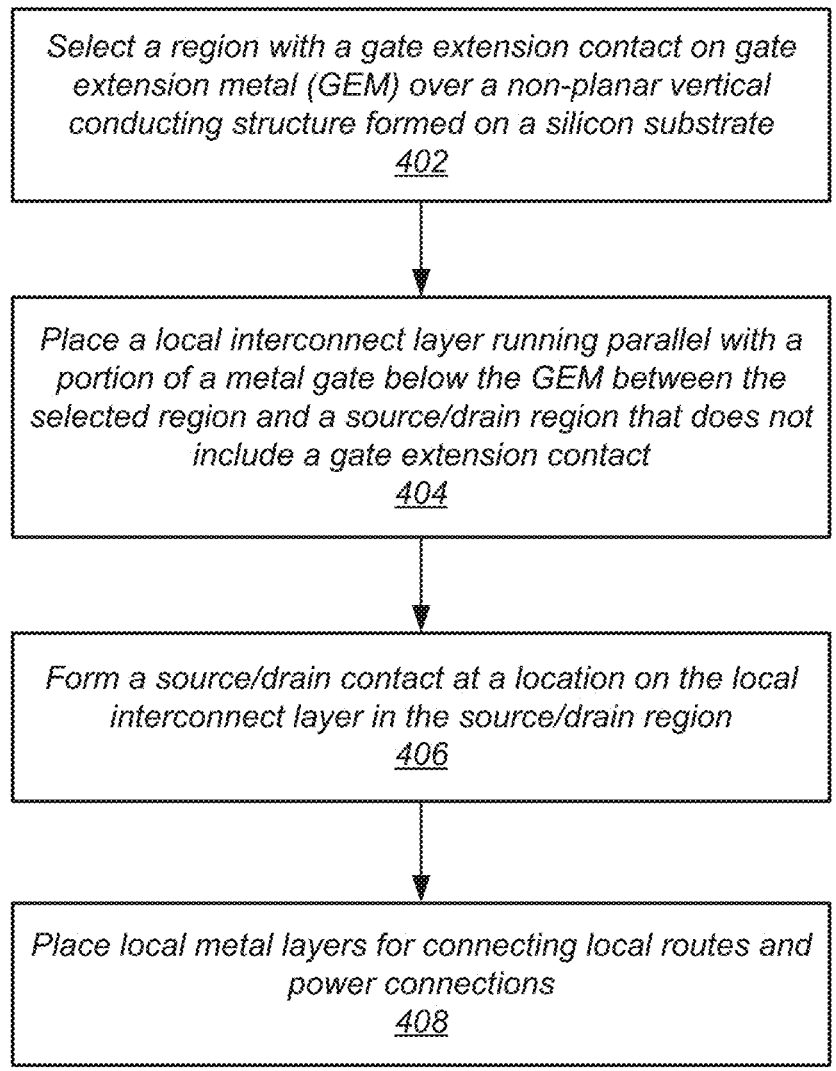
FIG. 4 is a generalized diagram of a method for creating cell layout with contacts over gates in an active region of a non-planar device.

Referring now to FIG. 4, a generalized block diagram of a method 400 for creating cell layout with contacts over gates in an active region of a non-planar device is shown. A region is selected with an existing gate extension contact on gate extension metal (GEM) over a non-planar vertical conducting structure formed on a silicon substrate (block 402). In one example, referring briefly again to cell layout 100 of FIG. 2, the region including the gate extension contact 118 at the top of the sixth column from the left is selected. A local interconnect layer is placed running parallel with a portion of a metal gate below the GEM between the selected region and a source/drain region that does not include a gate extension contact (block 404).

A source/drain contact is formed at a location on the local interconnect layer in the source/drain region (block 406). Referring briefly again to cell layout 100 of FIG. 2, source/drain contact 132 is placed to the right and below gate extension contact 118 at the top of the sixth column from the left. As shown in the cross-section view of FIG. 2, each of the local interconnect layer 130 and the source/drain contact 132 are placed between each of two gate metals and two gate extension metals (GEMs). Local metal layers for connecting local routes and power connections are placed (block 408). In some implementations, the cell layout is a standard cell in a cell layout library. In other implementations, the cell layout is a custom designed cell, which is separate from the standard cell layout library.

Figure 5:
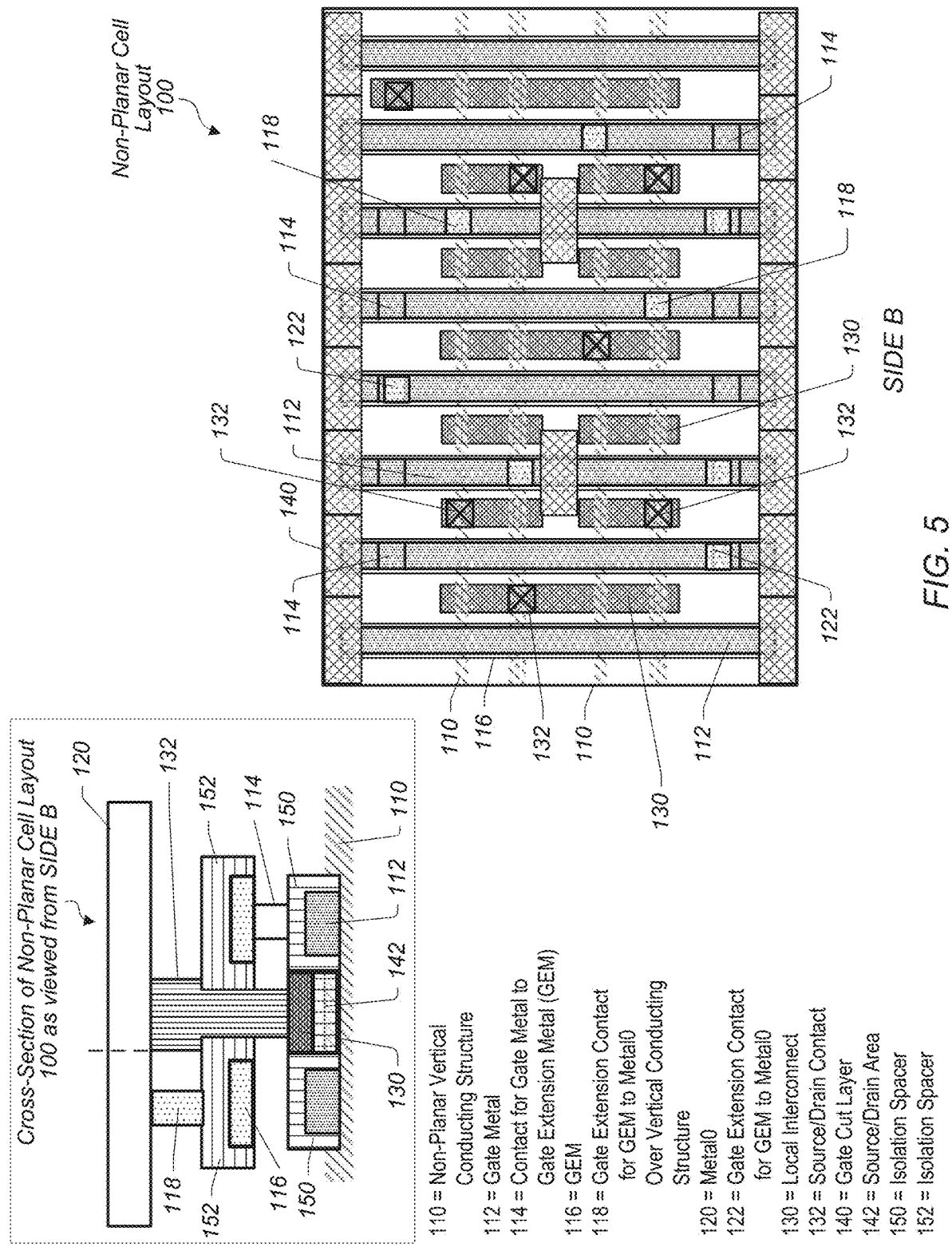
FIG. 5 is a generalized diagram of top and cross-sectional views of a cell layout with non-planar devices.

Turning now to FIG. 5, a generalized block diagram of non-planar cell layout 100, which is a top view of cell layout, is shown. Additionally, a generalized block diagram of a cross-section view of the same cell layout from Side B, is shown. As shown, Side B is at the bottom of non-planar cell layout 100. Layout elements described earlier are numbered identically. Although each of cell layouts 100 and 500 is shown as a two-dimensional diagram, there are three-dimensional elements depicted in the diagrams. As described earlier, each of the vertical structures 110 is considered vertical due to coming out of the page in a three-dimensional manner although the vertical structures 110 are routed in a horizontal direction. Additionally, in an implementation, in the cross-section view, source/drain contact 132 is further out of the page in a three-dimensional manner than gate extension contact 118. Next, gate extension contact 118 is further out of the page than each of gate contacts 114.

As described earlier, metal0 120 making contact with source/drain contact 132 is further out of the page than metal0 120 making contact with gate extension contact 118. Therefore, a dashed line in the cross-section view is used to separate the two separate horizontal routes of metal0 120. The metal0 120 on the right of the dashed line is further out of the page than the metal0 120 on the left of the dashed line. In an implementation, in the cross-section view, each of gate extension contact 118 and vertical structure 110 is no further out of the page than the other. Accordingly, gate extension contact 118 is aligned vertically with vertical structures 110 in the cross-section view, and gate extension contact 118 is located above the active region.

As shown, local interconnect layer 130 is formed over source/drain region (area) 142. In various implementations, source/drain area 142 is formed by an implantation process. In the illustrated implementation, each of the gate metals 112 in the cross-section view is surrounded by isolated spacers 150. Similarly, each of the GEMs 116 is surrounded by isolated spacers 152. In some implementations, each of the isolated spacers 150 and 152 includes a same material. In other implementations, each of the isolated spacers 150 and 152 includes a different material. In an implementation, the material used for one or more of isolated spacers 150 and 152 is silicon nitride.

In an implementation, the gate metal 112 is placed with a height reaching the top of the isolated spacers 150. The isolated spacers are formed over the gate metal 112 and the two materials are etched to near the final height of the gate metal 112. More isolated spacer 150 is placed on top of the gate metal 112 followed by etching and polishing. For example, SiN deposition and chemical mechanical planarization (CMP) steps are used. An area is etched into the isolated spacer 150 for the gate contact 114, so that the gate contact 114 makes a physical connection with GEM 116 and gate 112. Next, tetraethyl orthosilicate (TEOS) or other oxide deposition occurs followed by a trench is formed for GEM 116. In another implementation, the isolated spacer 150 is patterned and etched after it is deposited on the gate metal 112 followed by an oxide deposition, such as a TEOS deposition. Afterward, the trench for the GEM 116 is formed and then the final via etch.

Cell layout 500 shows the source/drain contact 132 is dual self-aligned by the GEM 116 and Metal0 layer 120. The Metal0 layer 120 self-aligns the source/drain contact 132 into and out of the page. The isolated spacer 152 on the GEM 116 self-aligns the source/drain contact 132. If the GEM 116 is misaligned, then the isolated spacer 150 on the gate meal 112 self-aligns the source/drain contact 132 to the local interconnect layer 130.

Figure 6:
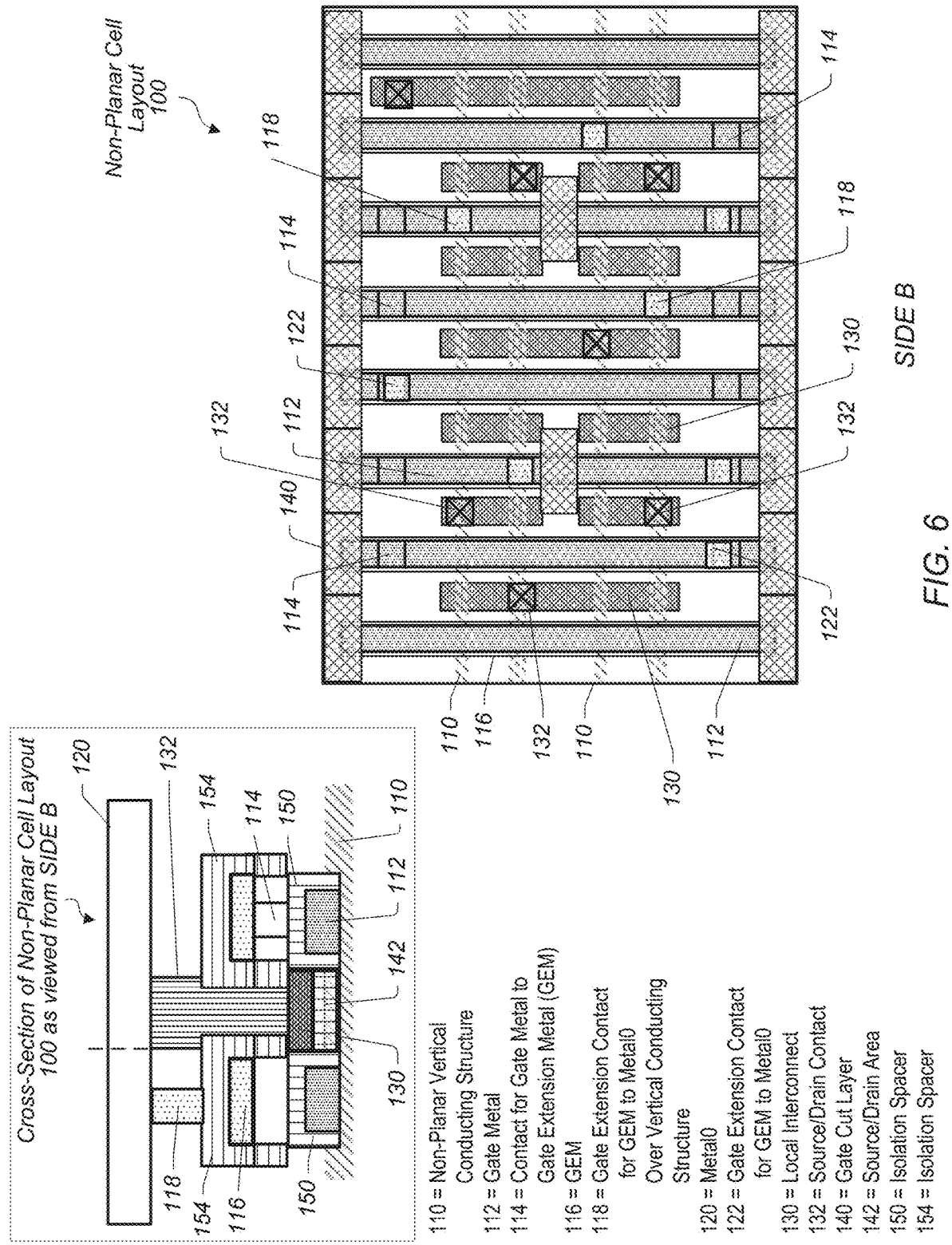
FIG. 6 is a generalized diagram of top and cross-sectional views of a cell layout with non-planar devices.

Turning now to FIG. 6, a generalized block diagram of non-planar cell layout 100, which is a top view of cell layout, is shown. Additionally, a generalized block diagram of a cross-section view of the same cell layout from Side B, is shown. As shown, Side B is at the bottom of non-planar cell layout 100. Layout elements described earlier are numbered identically. In the illustrated implementation, the isolated spacer 154 reaches down to the gate metal 112 as shown in the cross-section view. Isolated spacer 154 provides further alignment and further isolation. In some implementations, each of the isolated spacers 150 and 154 includes a same material. In other implementations, each of the isolated spacers 150 and 154 includes a different material.

Figure 7:
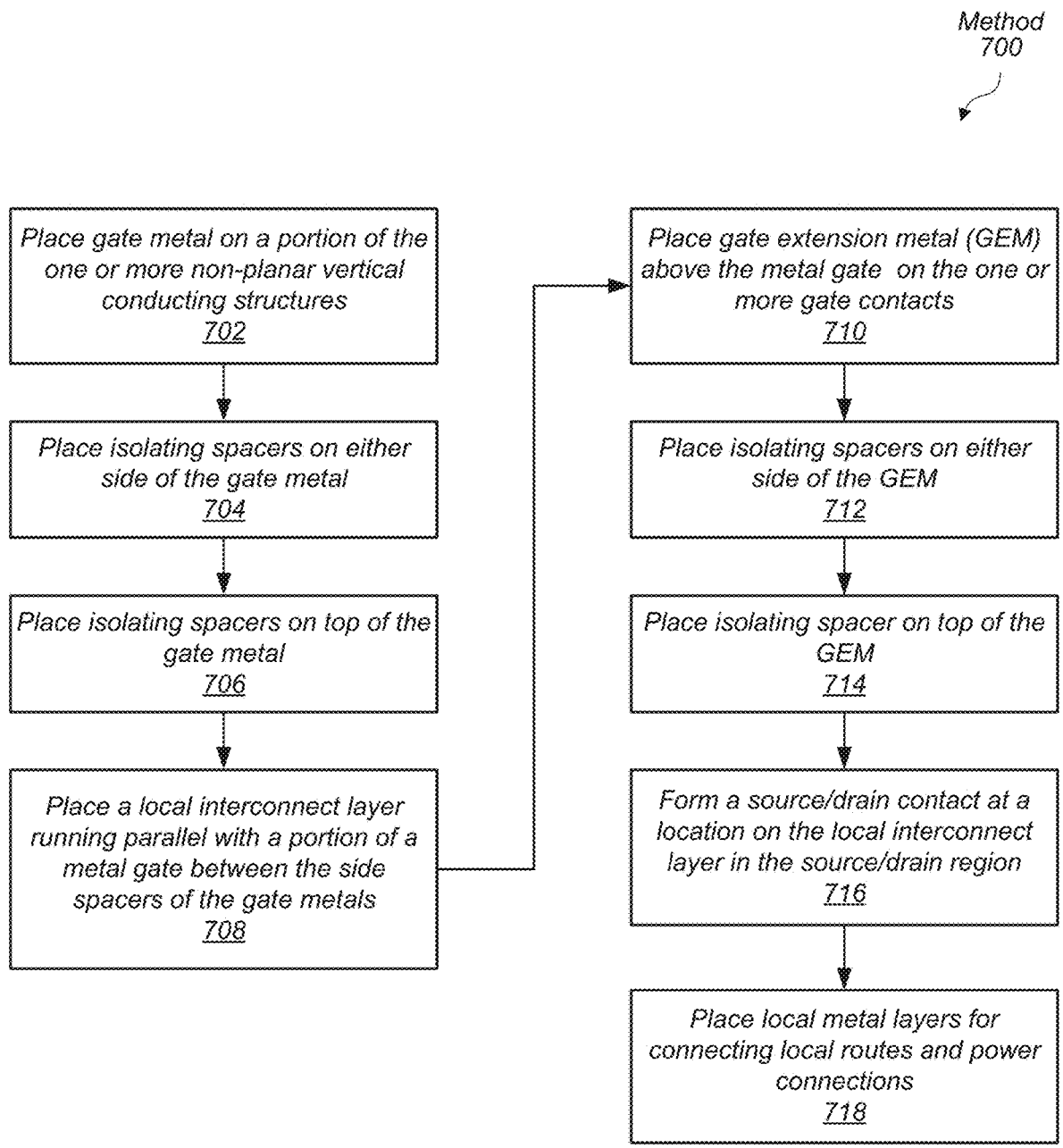
FIG. 7 is a generalized diagram of a method for creating cell layout with contacts over gates in an active region of a non-planar device.

Referring now to FIG. 7, a generalized block diagram of a method 700 for creating cell layout with contacts over gates in an active region of a non-planar device is shown. Gate metal is placed on a portion of one or more non-planar vertical conducting structures (block 702). Isolating spacers are placed on either side of the gate metal (block 704). Isolating spacers are placed on top of the gate metal (block 706). A local interconnect layer is placed running parallel with a portion of a metal gate between the side spacers of the gate metals (block 708).

Gate extension metal (GEM) is placed above the metal gate on the one or more gate contacts (block 710). Isolating spacers are placed on either side of the GEM (block 712). Isolating spacer is placed on top of the GEM (block 714). A source/drain contact is formed at a location on the local interconnect layer in the source/drain region (block 716). Local metal layers are placed for connecting local routes and power connections (block 718). In some implementations, the cell layout is a standard cell in a cell layout library. In other implementations, the cell layout is a custom designed cell, which is separate from the standard cell layout library.

It is noted that one or more of the above-described implementations include software. In such implementations, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various implementations, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the implementations above have been described in considerable detail, numerous variations and modifications will become apparent to those skilled in the art once the above disclosure is fully appreciated. It is intended that the following claims be interpreted to embrace all such variations and modifications.

What is claimed is:

1. A semiconductor device fabrication process for creating a standard cell layout comprising:
   forming one or more non-planar vertical conducting structures on a silicon substrate;
   placing gate metal on a portion of the one or more non-planar vertical conducting structures;
   forming one or more gate contacts on one or more ends of the gate metal;
   placing gate extension metal (GEM) above the gate metal on the one or more gate contacts, wherein the GEM uses a connection to a local metal zero layer to route a gate connection to any other via or contact; and
   forming a gate extension contact at a location on the GEM above and aligned with one of the one or more non-planar vertical conducting structures where the local metal zero layer is available to be used for routing the gate connection.

2. The semiconductor device fabrication process as recited in claim 1, further comprising:
   selecting a region with a gate extension contact on gate extension metal (GEM) over a non-planar vertical conducting structure formed on a silicon substrate; and
   placing a local interconnect layer running parallel with a portion of a gate metal below the GEM between the selected region and a source/drain region that does not include a gate extension contact.

3. The semiconductor device fabrication process as recited in claim 2, further comprising forming a source/drain contact at a location on the local interconnect layer in the source/drain region that does not include a gate extension contact.

4. The semiconductor device fabrication process as recited in claim 1, further comprising:
placing isolating spacers on either side of the gate metal and on top of the gate metal; and
placing a local interconnect layer running parallel with a portion of the gate metal along a spacer on the side of the gate metal.

5. The semiconductor device fabrication process as recited in claim 1, further comprising:
placing isolating spacers on either side of the GEM and on top of the GEM; and
forming a source/drain contact along a spacer on the side of the GEM.

6. The semiconductor device fabrication process as recited in claim 1, wherein the GEM is placed only above the gate metal throughout the standard cell layout.

7. The semiconductor device fabrication process as recited in claim 1, wherein each of the one or more non-planar vertical conducting structures comprises a semiconductor Fin.

8. The semiconductor device fabrication process as recited in claim 1, wherein each of the one or more non-planar vertical conducting structures comprises a semiconductor nanowire.

9. The semiconductor device fabrication process as recited in claim 1, further comprising forming a source/drain contact at a location on a local interconnect layer in the source/drain region.

10. The semiconductor device fabrication process as recited in claim 9, wherein the location on the local interconnect layer in the source/drain region does not include a gate extension contact.

11. A semiconductor structure comprising:
one or more non-planar vertical conducting structures on a silicon substrate;
gate metal on a portion of the one or more non-planar vertical conducting structures;
one or more gate contacts on one or more ends of the gate metal;
gate extension metal (GEM) above the gate metal on the one or more gate contacts; and
a gate extension contact at a location on the GEM above and aligned with one of the one or more non-planar vertical conducting structures where a local metal zero layer is available to be used for routing a gate connection.

12. The semiconductor structure as recited in claim 11, further comprising:
a region with a gate extension contact on gate extension metal (GEM) over a non-planar vertical conducting structure formed on a silicon substrate; and
a local interconnect layer running parallel with a portion of a gate metal below the GEM between the selected region and a source/drain region that does not include a gate extension contact.

13. The semiconductor structure as recited in claim 10, further comprising a source/drain contact at a location on the local interconnect layer in the source/drain region that does not include a gate extension contact.

14. The semiconductor structure as recited in claim 9, further comprising:
isolated spacers on either side of the gate metal and on top of the gate metal; and
a local interconnect layer running parallel with a portion of the gate metal along a spacer on the side of the gate metal.

15. The semiconductor structure as recited in claim 9, further comprising:
isolated spacers on either side of the GEM and on top of the GEM; and
a source/drain contact along a spacer on the side of the GEM.

16. The semiconductor structure as recited in claim 9, wherein the GEM is placed only above the gate metal throughout the standard cell layout.

17. The semiconductor structure as recited in claim 9, wherein each of the one or more non-planar vertical conducting structures comprises a semiconductor Fin.

18. The semiconductor structure as recited in claim 9, wherein each of the one or more non-planar vertical conducting structures comprises a semiconductor nanowire.

19. The semiconductor structure as recited in claim 11, further comprising a source/drain contact at a location on a local interconnect layer in the source/drain region that does not include a gate extension contact.

20. The semiconductor structure as recited in claim 19, wherein the location on the local interconnect layer in the source/drain region does not include a gate extension contact.

* * * * *

UNITED STATES PATENT AND TRADEMARK OFFICE
CERTIFICATE OF CORRECTION

PATENT NO. : 10,818,762 B2
APPLICATION NO. : 15/989604
DATED : October 27, 2020
INVENTOR(S) : Richard T. Schultz Page 1 of 1

It is certified that error appears in the above-identified patent and that said Letters Patent is hereby corrected as shown below:

In the Claims

Column 10, Claim 13, Line 10, please delete "claim 10" and substitute -- claim 12 --.

Column 10, Claim 14, Line 14, please delete "claim 9" and substitute -- claim 11 --.

Column 10, Claim 15, Line 21, please delete "claim 9" and substitute -- claim 11 --.

Column 10, Claim 16, Line 27, please delete "claim 9" and substitute -- claim 11 --.

Column 10, Claim 17, Line 30, please delete "claim 9" and substitute -- claim 11 --.

Column 10, Claim 18, Line 33, please delete "claim 9" and substitute -- claim 11 --.

Signed and Sealed this
Twentieth Day of April, 2021

Drew Hirshfeld
*Performing the Functions and Duties of the
Under Secretary of Commerce for Intellectual Property and
Director of the United States Patent and Trademark Office*